United States Patent
Ham et al.

(10) Patent No.: US 6,822,452 B2
(45) Date of Patent: Nov. 23, 2004

(54) MRI APPARATUS

(75) Inventors: Cornelis Leonardus Gerardus Ham, Eindhoven (NL); Jan Konijn, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 47 days.

(21) Appl. No.: 10/023,163

(22) Filed: Dec. 18, 2001

(65) Prior Publication Data

US 2002/0079897 A1 Jun. 27, 2002

(30) Foreign Application Priority Data

Dec. 22, 2000 (EP) .............................................. 00204797

(51) Int. Cl.$^7$ ................................................ G01V 3/00
(52) U.S. Cl. ...................................... 324/320; 324/319
(58) Field of Search ................................ 324/320, 319, 324/318, 309, 307, 300, 322; 335/216, 301, 298; 128/653.2; 600/13

(56) References Cited

U.S. PATENT DOCUMENTS

| | | | |
|---|---|---|---|
| 4,535,291 A | * 8/1985 | Lee et al. | 324/320 |
| 4,733,189 A | * 3/1988 | Punchard et al. | 324/318 |
| 4,978,920 A | * 12/1990 | Mansfield et al. | 324/318 |
| 5,083,085 A | 1/1992 | Morad | 324/318 |
| 5,555,251 A | 9/1996 | Kinanen | 324/319 |
| 5,661,401 A | * 8/1997 | Ishikawa et al. | 324/320 |
| 5,721,490 A | * 2/1998 | Takano et al. | 324/322 |
| 6,278,275 B1 | * 8/2001 | Petropoulos et al. | 324/318 |

FOREIGN PATENT DOCUMENTS

| | | | | |
|---|---|---|---|---|
| DE | 3328369 A | * | 7/1984 | |
| JP | 11221200 | * | 2/1998 | |
| JP | 9266894 | * | 4/1998 | |
| WO | WO9401785 | | 1/1994 | ........... G01R/33/20 |
| WO | WO0025146 | | 4/2000 | ......... G01R/33/421 |

OTHER PUBLICATIONS

Stewart C. Bushing: Magnetic Resonance Imaging (1996) pp 148–150, Mosby Publication.*

* cited by examiner

Primary Examiner—Brij B. Shrivastav
(74) Attorney, Agent, or Firm—John Vodopia

(57) ABSTRACT

The invention relates to a magnetic resonance imaging (MRI) apparatus (1) comprising a gradient coil assembly (3, 4, 5) for generating gradient magnetic fields in an imaging volume, the gradient coil assembly (3, 4, 5) comprising at least three gradient coils (6) for generating three different gradient magnetic fields. In order to compensate self-induced eddy currents in the gradient coils it is proposed according to the invention to provide a conductive element (71, 72, 73) in close proximity to at least one of the gradient coils (6) in order to compensate self-induced eddy currents in the gradient coil assembly (3, 4, 5). It is thus achieved that undesirable high-order behaviour of the gradient coils is suppressed and that conductive elements (71, 72, 73) are provided in the gradient coil assembly (3, 4, 5) such that undesirable high-order behavior of the gradient coils (3, 4, 5) is suppressed and the nature of the short term self-eddy field becomes similar to that of the gradient coils (3, 4, 5).

10 Claims, 7 Drawing Sheets

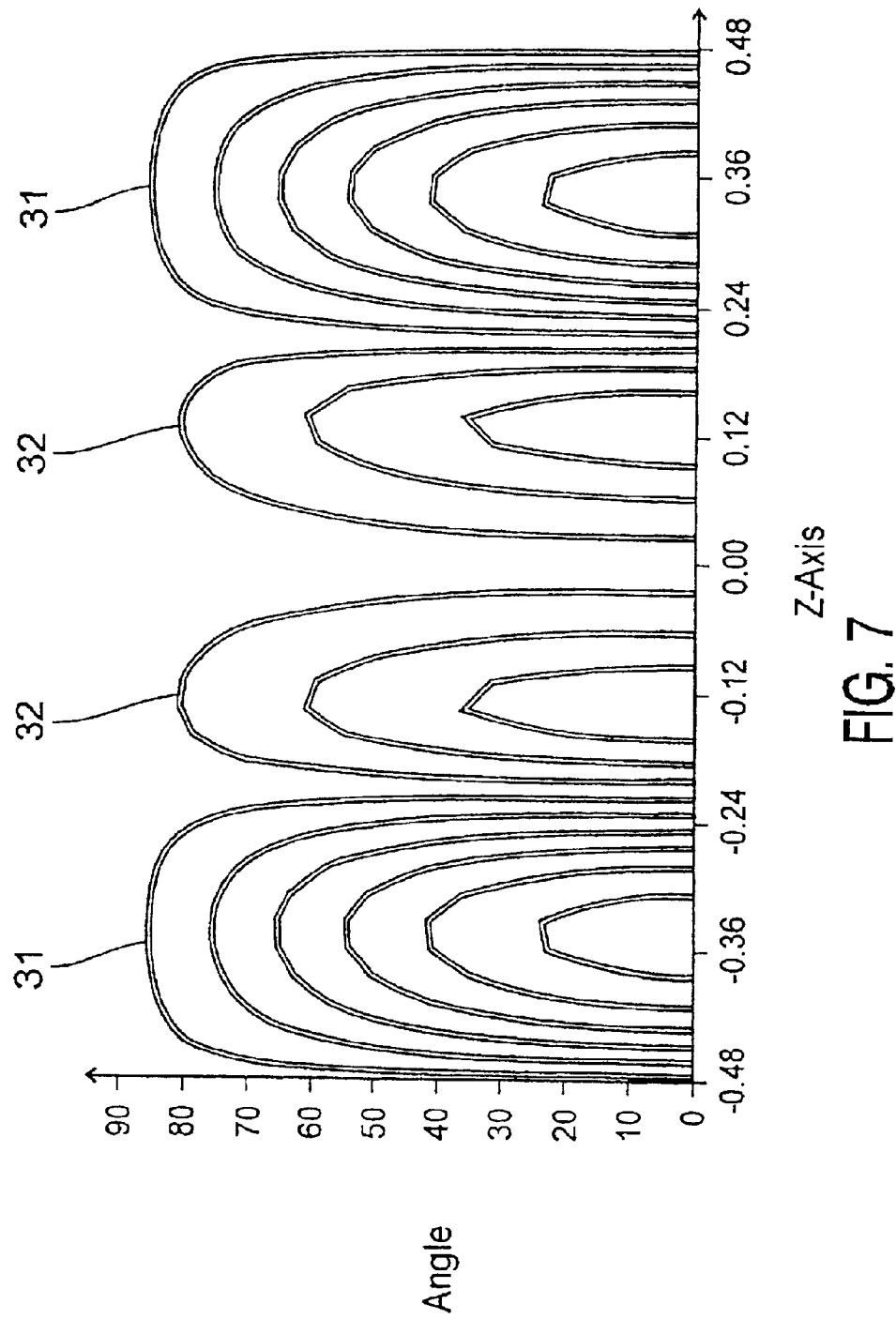

C30 coil

MRI APPARATUS

FIELD OF THE INVENTION

The invention relates to a magnetic resonance imaging apparatus (MRI apparatus) comprising a gradient coil assembly for generating gradient magnetic fields in an imaging volume, the gradient coil assembly comprising at least three gradient coils for generating three different gradient magnetic fields.

BACKGROUND OF THE INVENTION

Such an MRI apparatus is known in general and is widely used. In such an apparatus it is necessary to superpose strong, rapidly changing gradient magnetic fields on a very homogeneous static magnetic field. These gradient magnetic fields spatially define the imaging volume and are produced by coils carrying precisely controlled current pulses. Because of the so-called skin effect, the currents do not always flow along the intended paths in an x-, y- or z-gradient coil during or immediately after activation. Moreover, during or immediately after activation eddy currents could be induced in the other coils, in an RF screen or in other parts of the apparatus. Such effects give rise to cause time-dependent fields which cause the delay of the field to be a function of the position in space. This results in an integral field error with time as its dimension which can be written as a series of Legendre coefficients, each having one or more time constants. Consequently, artifacts may occur in certain sequences used by the MRI apparatus.

A known solution consists in the use of litz wires. The manufacturing process utilizing litz wire is expensive. The placement of the litz wire is not very precise, resulting in an unpredictable eddy current behavior in the magnet, which in its turn leads to in image quality problems. Another known solution consists in the use of narrow conductors. This is more expensive than wide conductors. It also means more dissipation and requires higher voltages.

An arrangement to minimize eddy currents in MR images is known from U.S. Pat. No. 5,555,251. In this arrangement gradient coils are positioned in the face of a pole piece, and thin disc shaped or ring shaped ferromagnetic parts of laminated layer cuts advantageously from transformer sheet material are attached to the face of the pole piece. To reduce eddy currents in these layers, narrow, radially oriented slots are cut in these layers before lamination. These layers are placed between the pole piece of the magnet and the gradient coil. Thus eddy currents in these parts are reduced only outside the gradient coil.

SUMMARY OF THE INVENTION

It is, therefore, an object of the invention to provide means for compensating self-induced eddy currents in the gradient coil assembly of an MRI apparatus as mentioned above.

This object is achieved by an MRI apparatus as claimed in claim 1 wherein a conductive element is provided in close proximity to at least one of the gradient coils in order to compensate self-induced eddy currents in the gradient coil assembly. The invention is based on the general idea to introduce pieces of a conductive material into the MRI apparatus so that the undesirable high-order behaviour can be suppressed and the nature of the short term self-eddy field becomes similar to that of the gradient coils. It has been recognized that self-induced eddy currents can best be compensated by locating the conductive element in close proximity to the gradient coil whose self-induced eddy current is to be compensated. In general, only one or several certain specific coils or all gradient coils can be provided with a conductive element which may all be identical or adapted to the respective gradient coil.

Preferred embodiments of the invention are disclosed in the dependent claims.

In preferred embodiments of the invention the conductive element is provided inside the at least one gradient coil or between an inner gradient coil element and an outer gradient coil element of the at least one gradient coil. The location of the conductive element may be a fixed part of the gradient coil in which case no apparatus-specific adjustment is required. The conductive element may also be provided in a different location within the apparatus. For example it may be integrated with the RF shield. The slitting of the RF shield can be adapted thereto, meaning that it is not designed for minimum short-term eddy currents but for the appropriate short-term eddy currents.

Furthermore, according to another aspect of the invention the conductive element comprises an active or passive coil loop which can be short-circuited in itself or can be connected to a separate loop amplifier. In both aspects the dimensions, shape and position of a short-circuited loop determine what field profile is corrected. The wire thickness determines the time constant when a short-circuited loop is used. Small current loops of this kind in principle induce only a time delay. Sometimes, however, acceleration is desirable. Positive currents can also be realized in the loop near the imaging region by connecting such a loop to a loop in the outer region. As a rule, the above short-term behaviour is determined to a high degree by the design of the conductive element.

In another embodiment of the invention the loop is driven by a signal taken from the at least one gradient coil using a transformer. Such a transformer could be made with parts of the gradient coil, for example by putting a pick-up, loop at the end of the gradient coil or on the outer side.

In another preferred embodiment of the invention the conductive element comprises a conductive pad, in particular a conductive foil or a conductive plate. Such a conductive foil may be a copper foil glued to the inner side of the gradient coil. Varying the dimension and/or slitting can restrict its effect to mainly one specific field shape and mainly one specific coil. Variation of the thickness influences the time constant and hence the special time delay. It is also possible to provide small metal plates, for example having a diameter of about 30 cm. Such conductive elements can be used for the x-, for the y- as well as for the z-gradient coil in general. The conductive pads or plates do not compensate as well as coils, that is, they do not have exactly the right field profile and interact with other coils that are switched, but this might be acceptable in many cases. The solution with conductive pads or plates is cheaper and easier to realize.

BRIEF DESCRIPTION OF THE DRAWINGS

The invention will now be explained in more detail with reference to the appended drawings, in which FIG. 7 shows a correction loop for an x-gradient coil according to the invention.

DETAILED DESCRIPTION OF THE PREFERRED EMBODIMENTS

Figure 1:
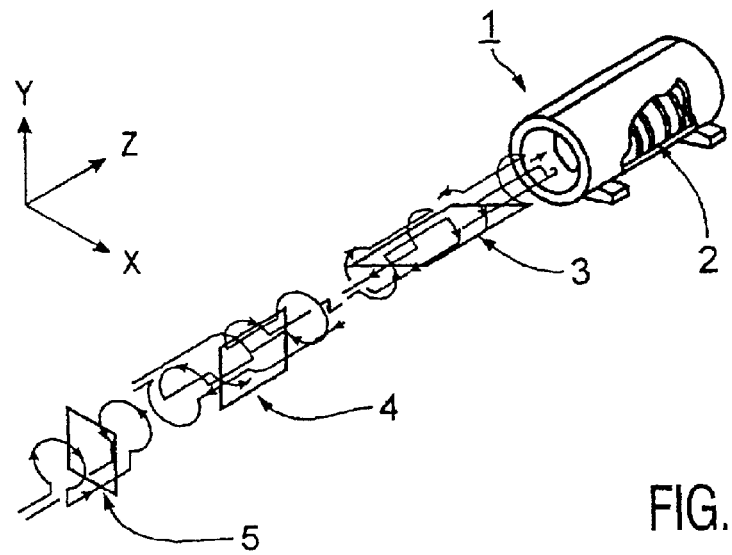
FIG. 1 shows the general layout of a gradient coil assembly in an MRI apparatus.

FIG. 1 shows the general layout of an MRI apparatus 1 comprising a gradient coil assembly. The MRI apparatus comprises a static field magnetic coil 2, x-gradient coils 3, y-gradient coils 4 and z-gradient coils 5. Each of the gradient coils 3, 4, 5 comprises a pair of coil elements to generate strong, rapidly changing gradient magnetic fields spatially defining the imaging volume. Each coil set is connected to an independently controlled power supply. In addition to producing gradients oriented along the x, the y or the z axis by powering the gradient coils in combination, it is possible to generate magnetic field gradients in any orientation. The gradients generated by these coils should be linear across the imaging volume and should be stable for the duration of the applied gradient. However, eddy currents are generated by the changing gradients in conducting parts like the metal shields of the magnets. The eddy currents in turn produce unwanted gradient fields at the area of interest, thus causing problems such as artifacts in images. Eddy currents are self-induced also in the gradient coils themselves also causing such artifacts.

Figure 2:
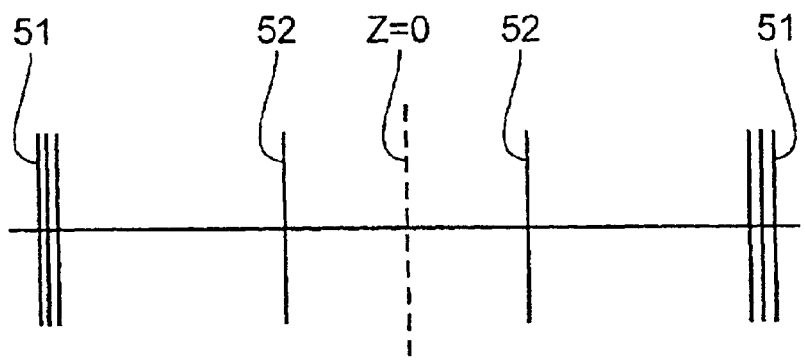
FIG. 2 illustrates the principle of the invention on the basis of a first embodiment.

The principle of the invention is shown in FIG. 2. This Figure shows a possible arrangement of a conductive element 52 in the form of a loop arranged around the z-axis and located at the inner side of the z-gradient coil 51. The z-coil 51 of this arrangement comprises three turns and the correction coil 52 comprises one turn, symmetrically arranged with respect to the z-axis and placed around the imaging volume. Both coils could, for example, be made of a wire having a thickness of 1 mm. The correction coil 52 could also be a foil glued to the inner side of the gradient coil support.

Figure 3:
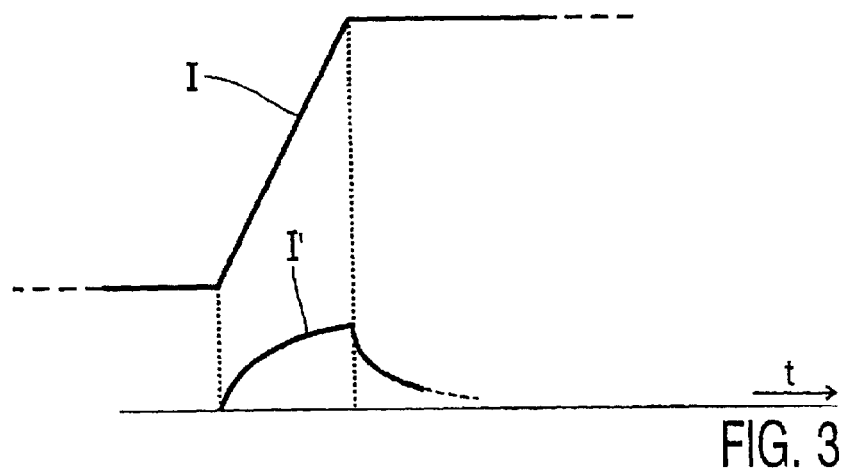
FIG. 3 shows the form of the gradient current used in the embodiment of FIG. 2.

The correction coil 52 should be driven by a current as shown in FIG. 3. It can be easily seen therein that the current I is time dependent. I' represents the time derivative of that current I, multiplied by some time constant.

Figure 4:
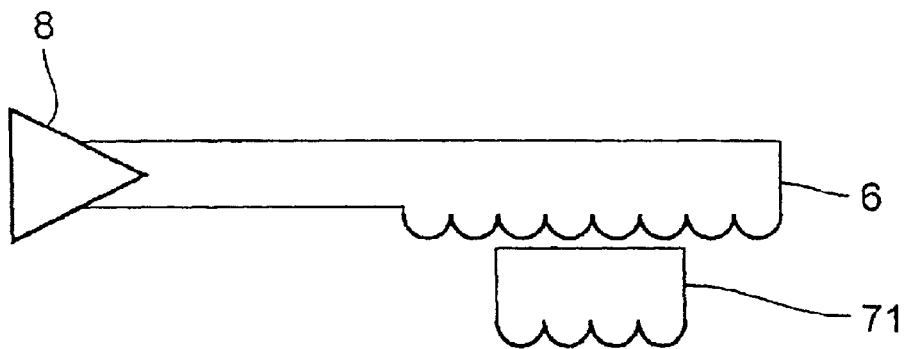
FIG. 4 shows a second embodiment of the invention.

FIG. 4 shows schematically the arrangement of a conductive element 71 for compensation of eddy currents for a gradient coil 6. The gradient coil 6 is connected to an amplifier 8 for driving the gradient coil. The conductive element is formed as a conductive closed loop which is located in close proximity to the gradient coil 6.

Figure 5:
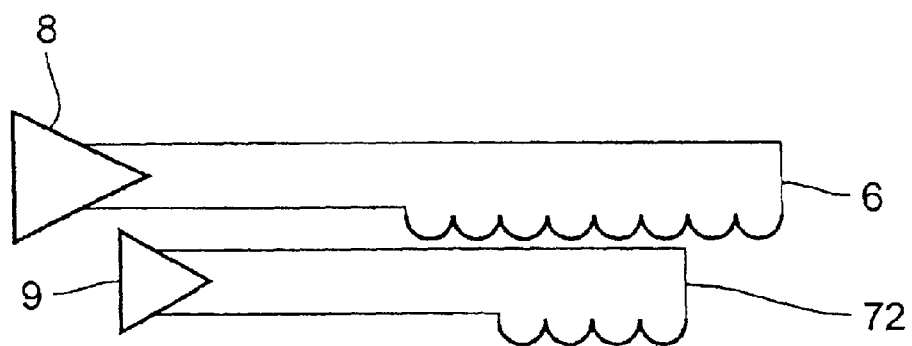
FIG. 5 shows a third embodiment of the invention.

Another embodiment of the invention is illustrated in FIG. 5 which shows another correction coil 72 having its own amplifier 9 for driving the correction coil 72.

Figure 6:
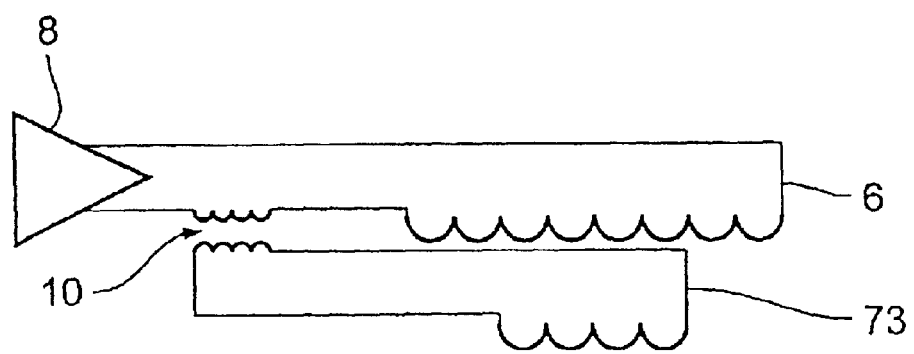
FIG. 6 shows a fourth embodiment of the invention.

Another embodiment of a correction coil 73 is shown in FIG. 6. Therein the correction coil 73 is driven by a transformer 10 located in the cable between the amplifier 8 and the gradient coil 6. Such a transformer 10 could also be made with parts of the gradient coil 6, for example by putting a pickup-loop at the end of the gradient coil 6 or at the outer side thereof.

A possible layout of a correction coil is illustrated in FIG. 7. This Figure shows the layout of a correction coil 32 located at the inner side of the x-gradient coil 31 along the z-axis. The correction coil 32 can either be a closed loop or can be actively driven, either via a dedicated amplifier or, for example, inductively from the x-gradient coil 31 itself via a transformer as shown in FIG. 6.

Figure 8A:
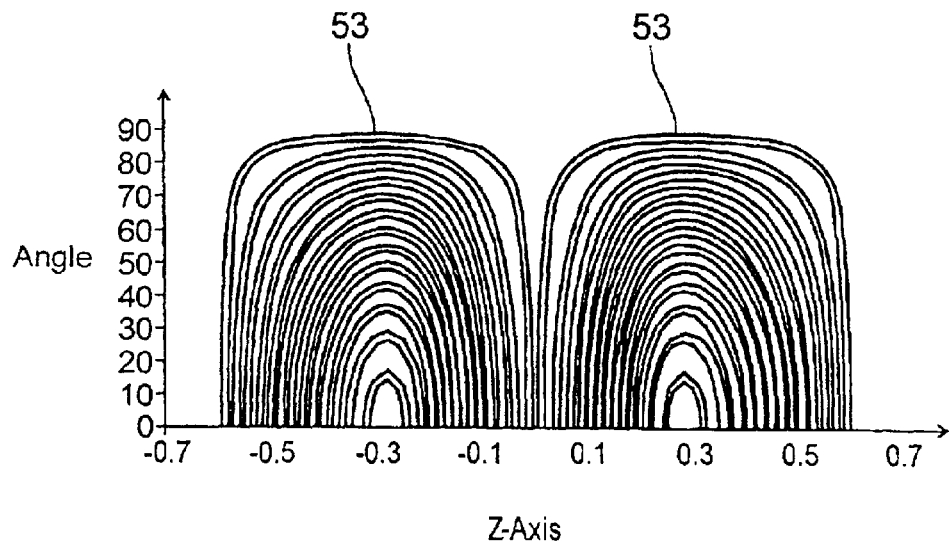
FIGS. 8A, 8B show the shape of an inner and an outer gradient coil element of an x-gradient coil.
Figure 8B:
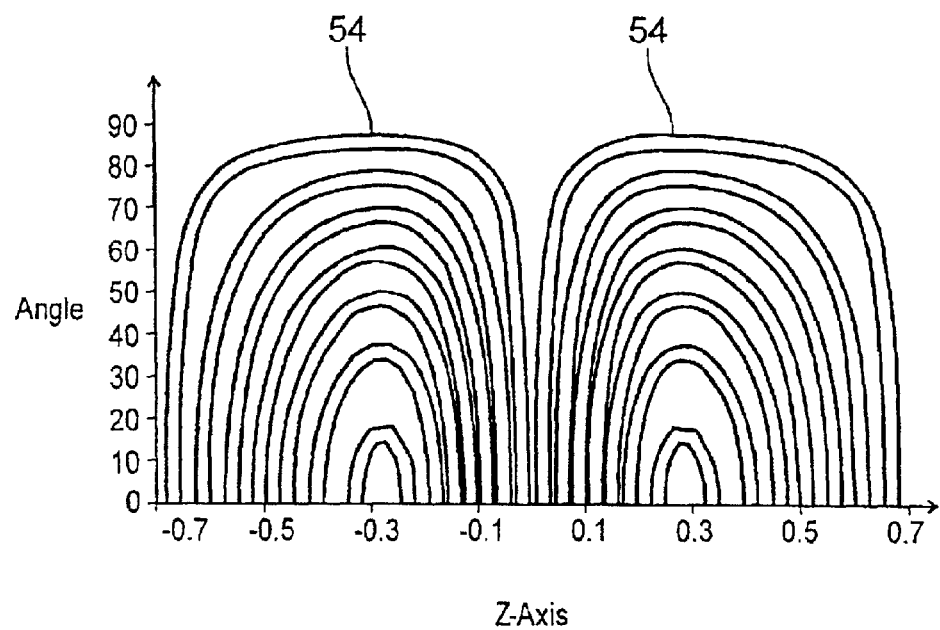

The layout of an inner gradient coil element 53 and an outer gradient coil element 54 of an x-gradient coil is shown in the FIGS. 8A, 8B. Between the inner and the outer gradient coil elements 53, 54 a conductive element can be located according to the invention.

Figure 9:
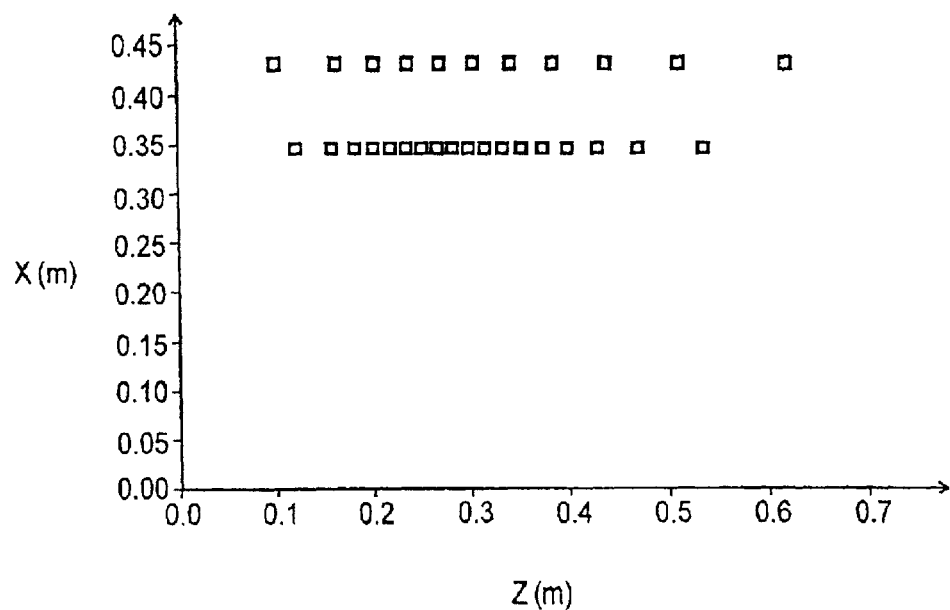
FIG. 9 shows a cross section of a z-gradient coil.
Figure 10:
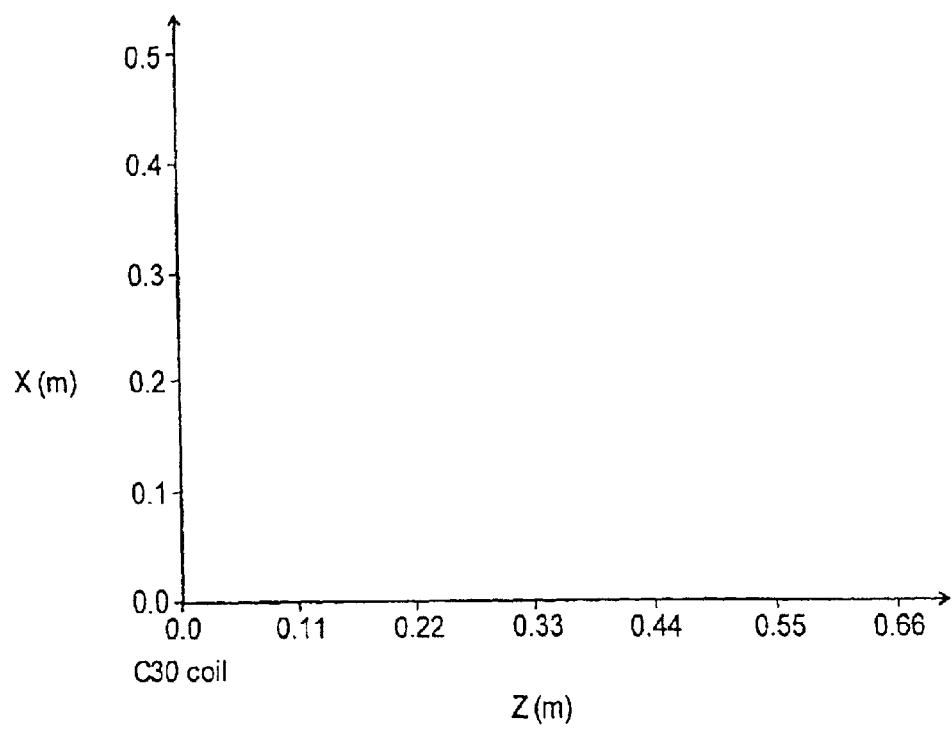
FIG. 10 shows a cross section of a correction coil for a z-gradient coil according to the invention.
Figure 11:
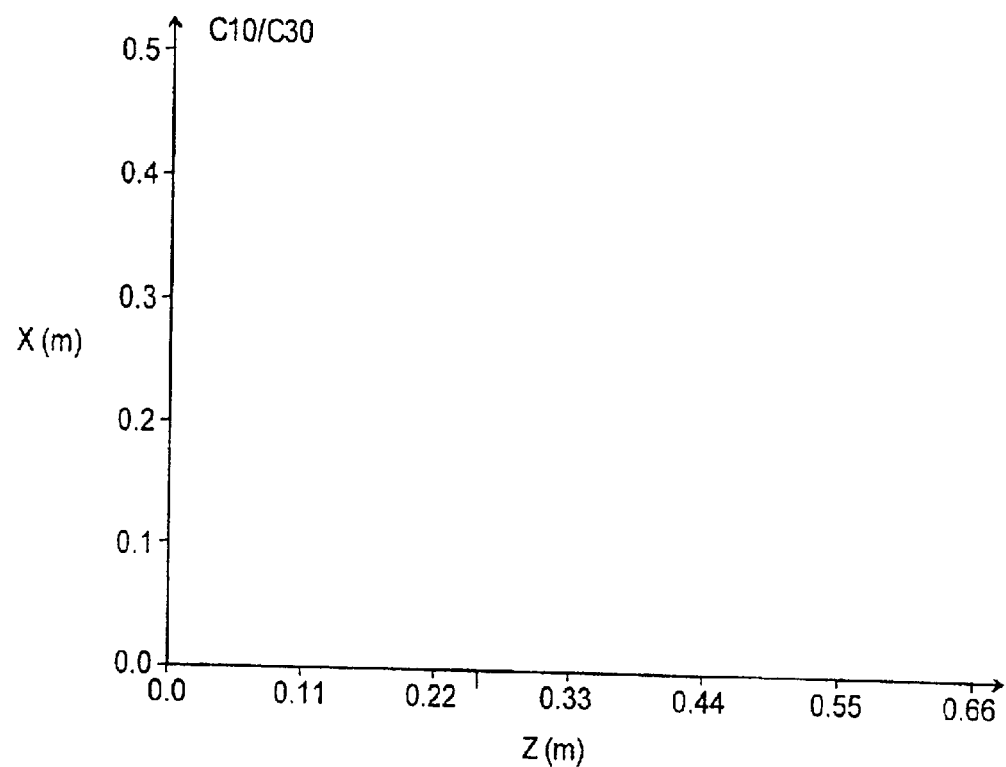
FIG. 11 shows a cross section of another embodiment of a correction coil for a z-gradient coil.

Further embodiments of correction coils according to the invention are shown in the FIGS. 9 to 11.

FIG. 9 shows an example of a z-gradient coil in a cross sectional view. The rectangles are cross sections of the conductors and only one quadrant of the plane is shown since the rest is symmetrical.

FIG. 10 shows an example of a correction coil, that is, again in a cross-sectional view. This coil produces a C30-type field (in Legendre series). The lines represent a collection of thin wires.

FIG. 11 shows another example of a correction coil, this time generating a C10+C30-type field. It could also be a wide copper foil or a slitted copper foil, that is, a foil slitted along the circumference. In that case it looks like a set of short-circuited loops again.

The correction coils have thin wires since the currents are small. The short lines shown in the FIGS. 9 to 11 denote a series of wires next to each other.

Figure 12:
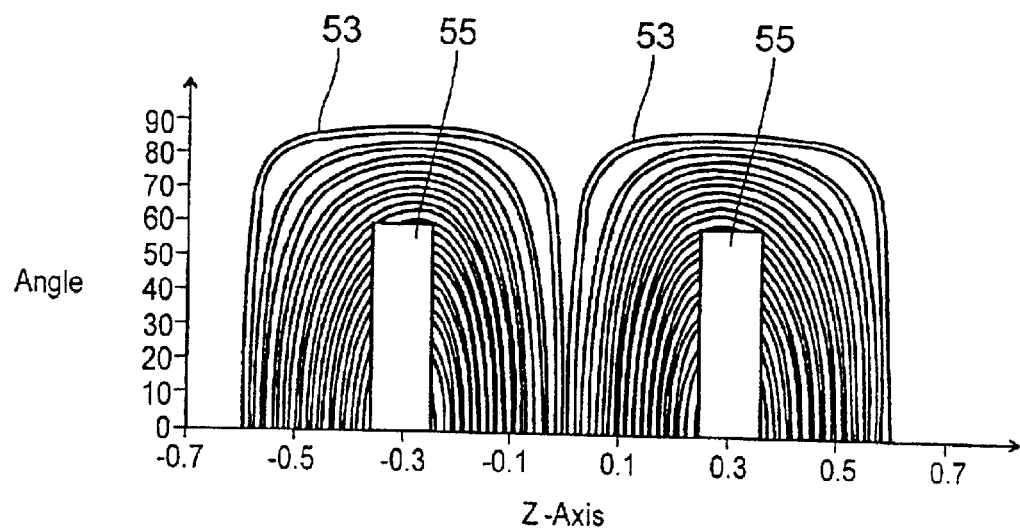
FIG. 12 shows the shape of a gradient coil element of an x-gradient coil having a conductive pad.

FIG. 12 shows the same inner x-coil 53 as FIG. 8A, but now with a conductive pad 55. This pad could, for example, be a foil that extends over 120 degrees and has a given width and thickness. The angle, width and z-position determine the field profile. The width and thickness determine the time constant.

Figure 13:
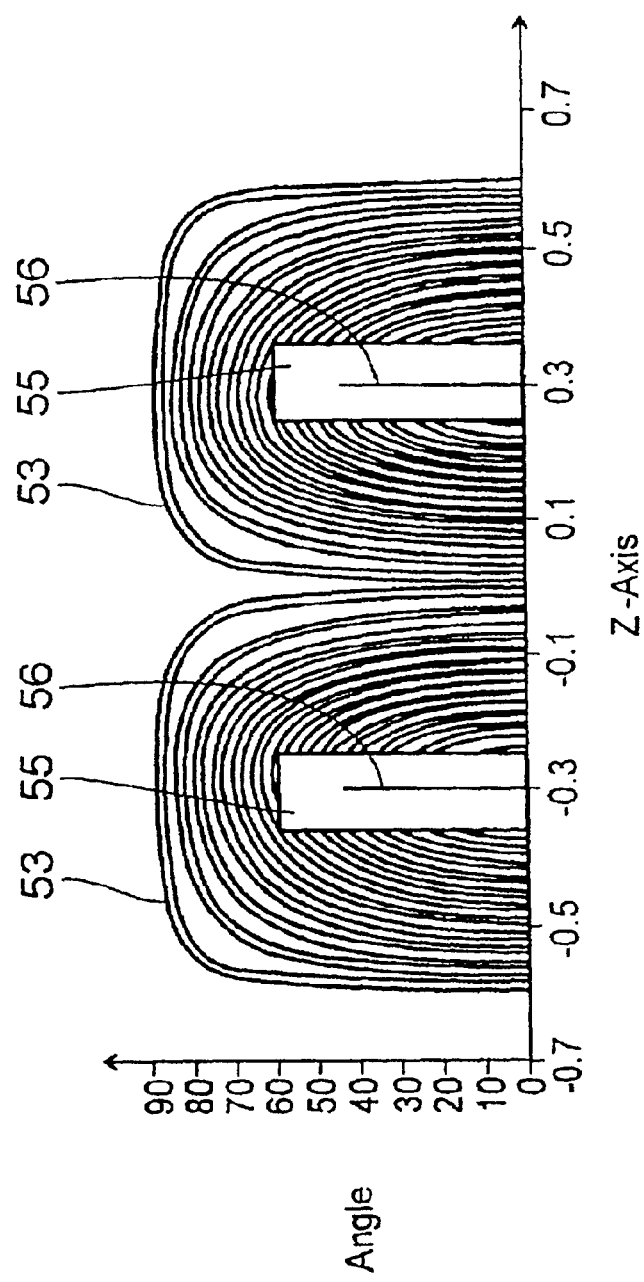
FIG. 13 shows the shape of a gradient coil element of an x-gradient coil similar to FIG. 12 and having a slit.

FIG. 13 is identical to FIG. 12, but now with a slit 56. This is to prevent or reduce eddy currents from the other coils (y and z). This configuration looks very much like a close-circuit loop.

It is to be noted that the embodiments described above are merely examples which do not limit the scope of the invention. The invention can be implemented in many other embodiments that are not shown herein, for example, different types of gradient coils for cylindrical magnets (oval coils, conical coils, asymmetrical coils), gradient coils for 'open' magnets, insert gradient coils, etc. The invention concerns to the general idea of using conductive elements which are provided in close proximity of a gradient coil in order to compensate self-induced eddy currents in the gradient coil assembly. Each gradient coil may have its own conductive element which can be adapted to the gradient coil in order to suppress high-order behaviour of the gradient coil and to ensure that conductive elements are provided in the gradient coil assembly such that undesirable high-order behavior of the gradient coils is suppressed and that the nature of the short term self-eddy field becomes similar to that of the gradient coils.

What is claimed is:

1. A magnetic resonance imaging apparatus (1) comprising a gradient coil assembly (3, 4, 5) for generating gradient magnetic fields in an imaging volume, the gradient coil assembly (3, 4, 5) comprising at least three gradient coils (3, 4, 5) for generating three different gradient magnetic fields, wherein a conductive element (71, 72, 73) is provided in close proximity to at least one of the gradient coils (3, 4, 5) in order to compensate self-induced eddy currents in the gradient coil assembly (3, 4, 5), wherein each of the gradient coils comprise a pair of coil elements arranged in different planar axis and connected to an independently controlled power supply, and wherein the conductive element (71, 72, 73) encompasses a substantially smaller surface area than the at least one of the aradient coils (3, 4, 5).

2. An apparatus as claimed in claim 1,
characterized in that the conductive element (71, 72, 73) is provided inside the at least one gradient coil (3, 4, 5).

3. An apparatus as claimed in claim 1,
characterized in that the conductive element (71, 72, 73) is provided between an inner gradient coil element and an outer gradient coil element of the at least one gradient coil (3, 4, 5).

4. An apparatus as claimed in claim 1,
characterized in that the conductive element (71, 72, 73) comprises an active or passive coil loop.

5. An apparatus as claimed in claim 4,
characterized in that the loop is short-circuited in itself.

6. An apparatus as claimed in claim 4,
characterized in that the loop is connected to a separate loop amplifier.

7. An apparatus as claimed in claim 4,
characterized in that the loop is driven by a signal taken from the at least one gradient coil (3, 4, 5) while using a transformer or a pickup-loop.

8. An apparatus as claimed in claim 1,
characterized in that the conductive element (71, 72, 73) comprises a conductive pad, in particular a conductive foil or a conductive plate.

9. An apparatus as claimed in claim 8,
characterized in that the conductive pad is slit.

10. An apparatus as claimed in claim 1,
characterized in that conductive elements (71, 72, 73) are provided in the gradient coil assembly (3, 4, 5) such that essentially undesirable high-order behavior of the gradient coils (3, 4, 5) is suppressed and that the nature of the short term self-eddy field becomes similar to that of the gradient coils (3, 4, 5).

* * * * *